Figure 4:
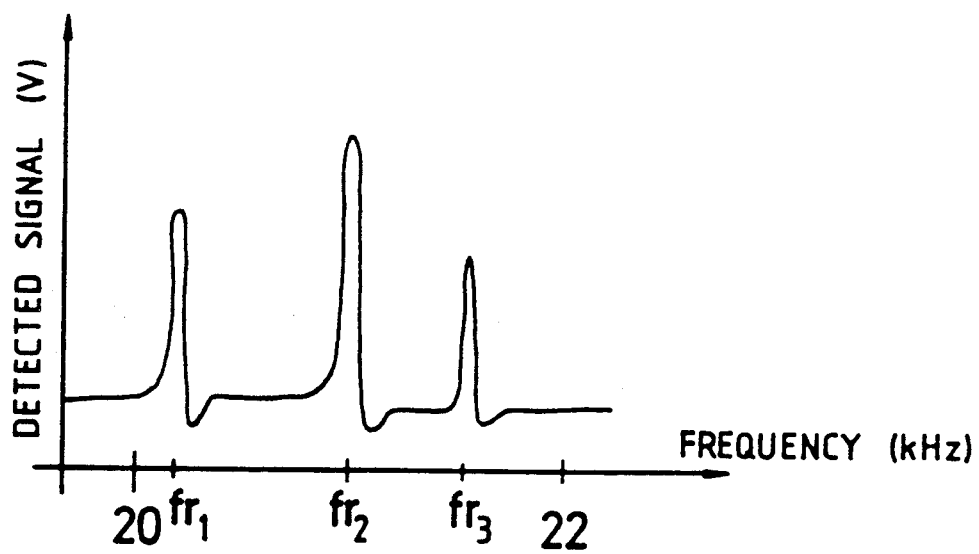

United States Patent [19]

Tyrén et al.

[11] Patent Number: 5,001,458
[45] Date of Patent: Mar. 19, 1991

[54] METHOD OF REMOTE SENSING OF OBJECTS

[76] Inventors: Carl H. Tyrén, Kämpagränden 19 B, S-233 76 Lund; Leif A. Persson, Kvarnvägen 85, S-437 00 Lindome, both of Sweden

[21] Appl. No.: 317,478
[22] PCT Filed: Aug. 13, 1987
[86] PCT No.: PCT/SE87/00358
§ 371 Date: Feb. 13, 1989
§ 102(e) Date: Feb. 13, 1989
[87] PCT Pub. No.: WO88/01427
PCT Pub. Date: Feb. 25, 1988

[30] Foreign Application Priority Data

Aug. 14, 1986 [SE] Sweden .................. 8603415

[51] Int. Cl.⁵ .................................. G08B 13/24
[52] U.S. Cl. .................................. 340/551; 340/572
[58] Field of Search ............................ 340/551

[56] References Cited

U.S. PATENT DOCUMENTS

| | | | |
|---|---|---|---|
| 3,832,530 | 8/1974 | Reitboeck et al. | 340/551 |
| 4,510,490 | 4/1985 | Anderson, III et al. | 340/551 |
| 4,622,543 | 11/1986 | Anderson, III et al. | 340/551 |
| 4,647,917 | 3/1987 | Anderson, III et al. | 340/572 |
| 4,654,641 | 3/1987 | Ferguson et al. | 340/551 |

FOREIGN PATENT DOCUMENTS

| | | |
|---|---|---|
| 78401 | 5/1983 | European Pat. Off. . |
| 96182 | 12/1983 | European Pat. Off. . |
| 170854 | 2/1986 | European Pat. Off. . |
| 216128 | 4/1987 | European Pat. Off. . |

Primary Examiner—Joseph A. Orsino
Assistant Examiner—Geoff Sutcliffe
Attorney, Agent, or Firm—Merchant, Gould, Smith, Edell, Welter & Schmidt

[57] ABSTRACT

A method and an arrangement of automatic remote identification of separate objects or separate objects in a set of objects, each object being provided with identifier means comprising identifiers made by material with high magnetomechanical coupling, the identifiers preferably comprising a plurality of strips of said material, the resonant frequency thereof being tuned to correspond to the desired information specific to the object, said objects being disposed in an interrogation zone when identification is requested. The method according to the invention comprises the steps of exposing essentially the whole of said zone to a magnetic bias field, generating in said zone a magnetic interference signal bringing said strips to oscillate at resonant frequencies, detecting the changes in the Young's modulus of said strips on said identifier means caused by said magnetic bias field, and utilizing said changes of the Young's modulus from the basic values to detect presence of individual strips and sets of strips, each set belonging to one identifier means.

10 Claims, 3 Drawing Sheets

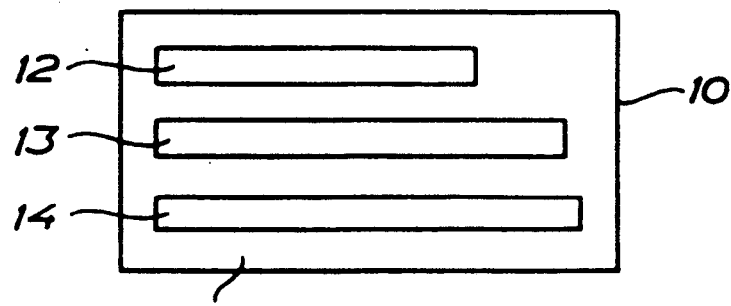
FIG. 1
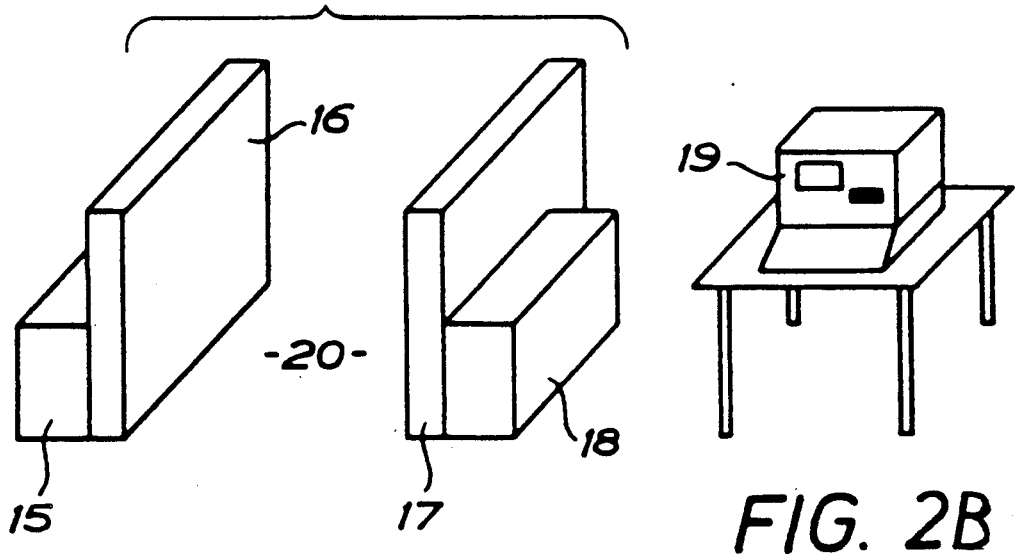
FIG. 2A
FIG. 2B
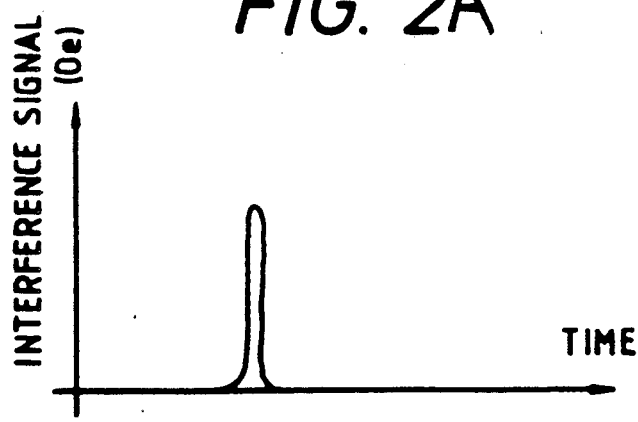
FIG. 3

METHOD OF REMOTE SENSING OF OBJECTS

The problem of remote detecting of articles and objects has been the subject of numerous technical solutions, the best of which correspond to the capacity of the human eye.

One method of improving the reliability of prior art detecting systems comprises the steps of providing on each article or object a marker or label which is more readily detected than the object itself. Such a system is utilized in stores where articles provided with bar code labels automatically are detected and entered in the recording counter when passed one by one in front of a detecting unit. Similar methods are utilized in factories where products are assembled in different parts of the premises and transported therebetween by means of conveyers and the like. Markers on the products make it possible to direct them automatically through the factory to desired locations therein.

One of the problems with systems utilizing bar code labels is the necessity of bringing an intact and completly visiable label within a narrow field of a vision of the detecting device.

New developments in this technical field, see EP-A2-0 096 182, have brought forth a system responsive to the presence of at least one of a plurality of markers within an interrogation zone, comprising:

a. means for defining an interrogation zone;
b. generating means for generating a magnetic field having a frequency band within said interrogating zone;
c. a plurality of markers appointed for passage through said interrogation zone, each of said markers being characterized by a substantial change in its effective magnetic permeability at a different preselected frequency within said frequency band that provides each of said markers with signal identity; and
e. detecting means for detecting resonances of said markers within said interrogation zone at each different preselected frequency.

The markers of this system comprise a plurality of elongated ductile strips of magnetostrictive ferromagnetic material each of said strips being disposed adjacent to a ferromagnetic element which, upon being magnetized, magnetically biases said strips and arms them to resonate at said preselected frequencies, each of said strips having a magnetomechanical coupling factor, k greater than 0, where $k=(1-f_r^2/f_a^2)$, fr and fa being the resonant and anti-resonant frequencies, respectively.

A major problem of the system disclosed in EP--A2-0 096 182 is the difficulty of detecting and identifying several markers provided with a plurality of strips, the strips beeing taken from a finite number of such strips without mismatching strips belonging to different markers. This problem does not occur when the system is used with a highly limited number of different markers and no attention is paid to the case when two or more identical markers occur at the same time in the interrogation zone.

In the EP-A2-0 096 182 the bias field is provided by a hard ferromagnetic material, i.e. a permanent magnet, located proximate the strips so as to make possible deactivation of the marker by demagnetization of the magnet, thus altering the resonant frequencies and preventing detection.

A subject of the present invention is to make possible automatic remote identification of a practically indefinite number of separate objects in a set of objects without placing restrictions on the location and visibility of the individual objects. In this aspect the identification capacity is superior to the capacity of the human eye.

Accordingly the method according to the invention has been given the characteristics appearing from claim 1.

Figure 5:
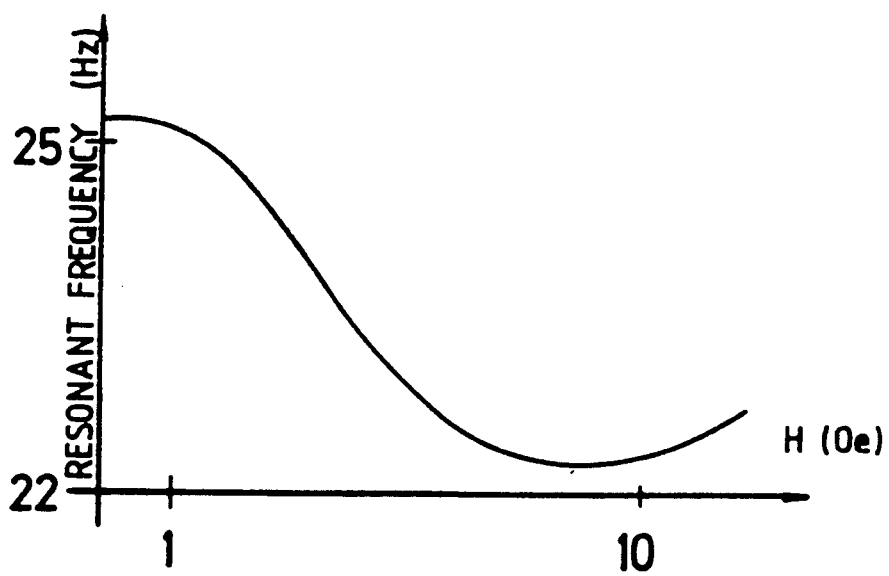
Figure 6:
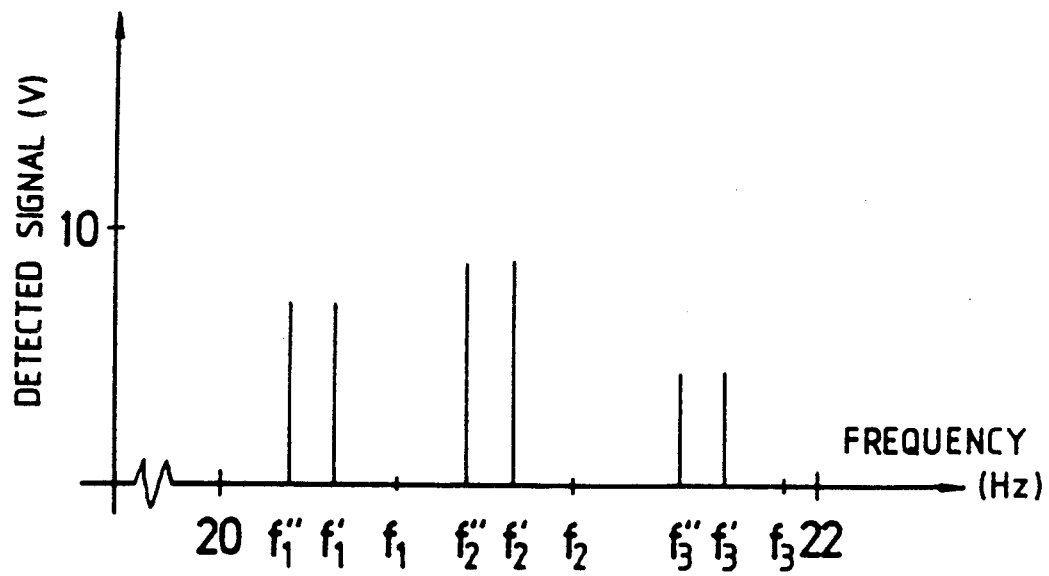
Figure 7:
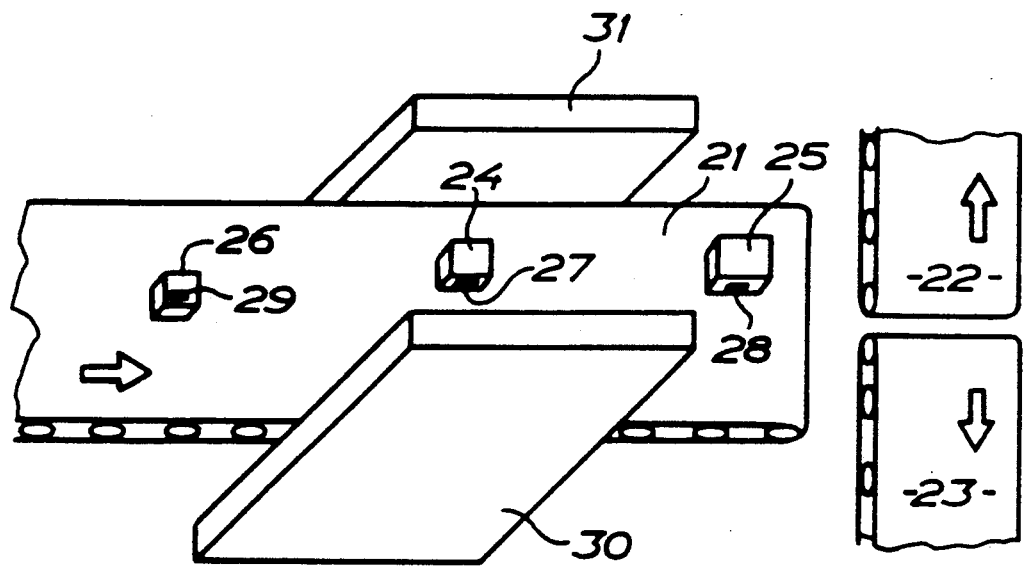

In order to explain the invention in more detail reference is made to the accompanying drawings, in which FIG. 1 is a plan view of a marker comprising three strips of magnetostrictive material, FIG. 2A is a perspective view of a detecting system for using the method according to the invention, FIG. 2B is a perspective view of a cashier desk for use with the detecting system shown in FIG. 2A for using the method according to the invention, FIG. 3 is a graph showing an interrogation signal applied to the interrogation zone, FIG. 4 is a graph showing the detected signal over a preselected frequency range, FIG. 5 is a graph depicting the magnetic field dependency of the resonant frequency for a strip containing an amorphous metal alloy, FIG. 6 is a schematic graph showing the frequency response signal detected from two identical markers exposed to different magnetic bias field strengths, and FIG. 7 is a perspective view of a conveyer system and a detecting system utilizing the method according to the invention.

The marker 10 according to FIG. 1 comprises a supporting layer 11 of fabric or paper and three magnetostrictive strips 12, 13, 14, the strips having different lengths and being made of amorphus ferromagnetic material in foil form and being exceedingly ductile. The marker 10 further comprises an covering layer, not shown, covering the strips 12, 13, 14 when the marker is used. When assembled the covering layer of the marker does not prevent the vibrations of the strips. Either of the supporting layer or the covering layer can be self adhesive so as to facilitate an easy attachment of the marker 10 on an object.

The arrangement according to FIGS. 2A and 2B utilizes the method of the invention to detect and identify automatically markers on goods and also to register automatically in a cash register the number of and prices of goods present in an interrogation zone 20. A customer in a store provided with said arrangement puts the articles he intends to buy in a bag, his pocket or in any other way and then he just passes the interrogation zone 20 to have the articles booked in the cash register. There is no need for removing the articles from the bag. A driver unit 15 and an exciting and bias generating coil unit 16 generate an exciting and a heterogenous magnetic bias field, together forming an interrogation field in the zone 20. The resulting magnetic field variations caused magnetomechanically by mechanical oscillations in the strips are detected and transformed to an electric signal by a receiver coil unit 17 and a processing unit 18. The processing unit 18 further comprises a frequency analyzer and is connected to a cash register 19. When objects with attached markers comprising strips are positioned in the zone 20 the Young's modulus of the strips are changed, the Young's modulus being dependent on the applied magnetic bias field. The variation of the Young's modulus can be detected by observing variations in the resonant frequency because the resonant frequency depends on the Young's modulus. An exciting signal according to FIG. 3 generated by an exciting unit and coil unit 16 brings all strips to oscillate at their resonant frequencies. These oscillations are easily detected in the receiver coil unit 17, the received signal being shaped as the signal shown in FIG. 4. The resonant frequency dependency on the applied magnetic bias field is shown in FIG. 5.

FIG. 6 is a graph showing the signal detected in the processing unit 18 when two identical markers are present in the interrogation zone 20 and an interrogation signal has been applied. Each marker comprises three strips of amorphous material. The three strips have different resonant frequencies, $f_1$, $f_2$ and $f_3$ when not exposed to the magnetic bias field. However, as a result of said magnetic bias field the resonant frequencies are changed and changed differently due to the difference in the applied heterogenous magnetic bias field. In first marker the frequencies are decreased to $f_{1'}$, $f_{2'}$, and $f_{3'}$, respectively, and in second marker the frequencies are decreased to $f_{1''}$, $f_{2''}$ and $f_{3'}$, respectively. Thus, two identical markers are easily detected simultaneously as two individual markers. The unique combinations of frequencies defining each marker are stored in a computer memory in the processing unit 18. While the number of different and unique frequencies can be limited to a few tens the number of combinations will be billions. The system of code utilized can correspond for instance to the bar code system present today.

If the heterogenous magnetic bias field is given a known value of intensity and/or direction in every different location of the interrogation zone 20 the frequency offset defines the exact position of the marker. In FIG. 7 such a field is applied on a first conveyer 21. Objects 24, 25, 26 provided with markers 27, 28, 29 are identified and the positions thereof on the conveyer are defined when said objects enters the zone between the coil units 30 and 31. Means not shown then move the objects from said first conveyer to a second conveyer 22 or a third conveyer 23 according to a predetermend program.

The magnetic bias field, the magnetic excitation field and the detection of the resulting strip signals may be accomplished with a single coil unit or with separate coil units. The magnetic field of the earth may also be used as the bias field.

The method according to the invention also opens up for the possibility of determining the direction of a strip and thus the direction of the object on which the strip is attached. This is based upon the fact that when an amorphus strip is rotated in the plane of a homogenous magnetic bias field its resonant frequency will change, since the component of the magnetic bias field along the strip axis changes when the direction of the strip is changed.

The method according to the invention may be developed to comprise also a credit card system. Such a system should comprise a credit card which is provided with the same type of marker as objects in a store. Relevant information stored on the marker is detected automatically by means of the method of the invention. In the fully automated system money from the bank account of the customer is then transferred to the bank account of the store.

The resonant frequency of the prefabricated strips can be modified or eliminated as magnetomechanical oscillators on the spot in a writing process, i.e. by means of a termal printer apparatus or the like, causing chrystallization or changes of the strips or parts thereof.

We claim:

1. Method of automatic remote identification of separate objects or separate objects in a set of objects, each object being provided with identifier means comprising identifiers made by material with high magnetomechanical coupling, the identifiers preferably comprising a plurality of strips of said material, resonant frequencies of said strips being tuned to correspond to desired information specific to the object, said objects being disposed in an interrogation zone when identification is requested, comprising the steps of:
   (a) exposing by external means essentially the whole of said zone to an essentially heterogenous magnetic bias field, generating in said zone a magnetic interference signal bringing said strips to oscillate at resonant frequencies, detecting the changes in the Young's modulus of said strips on said identifier means caused by said magnetic bias field; and
   (b) utilizing said changes of the Young's modulus from a value prior to exposure to said field to detect presence of individual strips and sets of strips, each set belonging to one identifier means.

2. Method of automatic remote identification as claimed in claim 1, further comprising a step of detecting changes in the resonant frequencies of said strips caused by said magnetic bias field.

3. Method as claimed in claim 1, further comprising a step of varying the strength of the magnetic bias field within a range, in which changes in the Young's modulus can be detected.

4. Method as claimed in claim 1, characterized in that the externally generated magnetic bias field has an essentially uniform flux density in a volume corresponding to one identifier means.

5. Method as claimed in claim 1, further comprising the step of processing said detected signals in an electronic processing unit.

6. Method as claimed in claim 1, characterized in that sensing means are arranged to detect a plurality of resonant frequencies.

7. Arrangement for carrying out a method of automatic remote identification of separate objects or separate objects in a set of objects, each object being provided with identifier means comprising identifiers made by material with high magnetomechanical coupling, the identifiers preferably comprising a plurality of strips of said material, resonant frequencies of said strips being tuned to correspond to desired information specific to the object, said objects being disposed in an interrogation zone when identification is requested, comprising means for exposing essentially the whole of said zone to a magnetic bias field, said means being arranged outside said zone, means for generating in said zone a magnetic interference signal, means for detecting the changes in the Young's modulus of said strips on said identifier means caused by said magnetic bias field, and means for utilizing said changes of the Young's modulus from a value determined prior to applying said exposure means to detect presence of individual strips and sets of strips, each set belonging to one identifier means.

8. Arrangement as claimed in claim 7, characterized in that the means for generating said magnetic bias field and said magnetic interference signal comprise a driver unit and a coil unit arranged outside said zone.

9. Arrangement as claimed in claim 7, characterized in that said detecting means comprise a receiver coil unit and a processing unit.

10. Arrangement as claimed in claim 8, characterized in that said generating and said detecting means comprise several coils, the direction of maximum sensitivity of said coils defining at least one plane.

* * * * *

UNITED STATES PATENT AND TRADEMARK OFFICE
CERTIFICATE OF CORRECTION

PATENT NO. : 5,001,458

DATED : 19 March 1991

INVENTOR(S) : Carl H. Tyren, Leif A. Persson

It is certified that error appears in the above-identified patent and that said Letters Patent is hereby corrected as shown below:

Column 1, line 51, delete "fr and fa" and insert --$f_r$ and $f_a$--.

Column 3, line 21 delete "$f_3,$" and insert --$f_{3''}$--.

Signed and Sealed this

First Day of December, 1992

Attest:

DOUGLAS B. COMER

Attesting Officer     Acting Commissioner of Patents and Trademarks